United States Patent
Schultz et al.

(10) Patent No.: US 6,350,841 B1
(45) Date of Patent: Feb. 26, 2002

(54) UNDERFILL ENCAPSULANTS PREPARED FROM ALLYLATED AMIDE COMPOUNDS

(75) Inventors: Rose Ann Schultz, Westford, MA (US); Donald Herr, Flemington; Chaodong Xiao, East Hanover, both of NJ (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/876,721

(22) Filed: Jun. 7, 2001

Related U.S. Application Data

(62) Division of application No. 09/336,633, filed on Jun. 18, 1999, now Pat. No. 6,316,566.
(60) Provisional application No. 60/091,507, filed on Jul. 2, 1998.

(51) Int. Cl.[7] ............................................. C08F 120/58
(52) U.S. Cl. .................. 526/305; 526/259; 526/262; 526/264; 526/304; 526/306; 526/310; 526/312
(58) Field of Search ................... 526/259, 262, 526/264, 304, 305, 306, 310, 312

(56) References Cited

U.S. PATENT DOCUMENTS

| | | | |
|---|---|---|---|
| 3,403,172 A | 9/1968 | Jordan et al. | 260/404.5 |
| 4,311,636 A | 1/1982 | Hahn et al. | 260/45.8 |
| 4,336,311 A | 6/1982 | Lucey | 428/521 |
| 4,450,650 A | 5/1984 | Klug et al. | 430/281 |
| 4,485,218 A | 11/1984 | Bell et al. | 525/257 |
| 4,533,975 A | 8/1985 | Bill | 361/323 |
| 4,613,637 A | 9/1986 | Landis et al. | 524/105 |
| 4,623,559 A | 11/1986 | Hudock | 427/54.1 |
| 4,663,424 A | 5/1987 | Stix et al. | 528/182 |
| 4,720,445 A | 1/1988 | Brahim et al. | 430/192 |
| 4,826,995 A | 5/1989 | Alexander et al. | 548/521 |
| 4,876,358 A | 10/1989 | Alexander | 548/521 |
| 4,980,436 A | 12/1990 | Saito et al. | 526/261 |
| 4,999,136 A | 3/1991 | Su et al. | 252/512 |
| 5,017,406 A | 5/1991 | Lutz | 427/54.1 |
| 5,137,936 A | 8/1992 | Akiguchi et al. | 522/170 |
| 5,258,426 A | 11/1993 | Uchida et al. | 523/435 |
| 5,272,377 A | 12/1993 | Shimozawa et al. | 257/787 |
| 5,314,950 A | 5/1994 | Singh et al. | 525/73 |
| 5,347,258 A | 9/1994 | Howard et al. | 338/333 |
| 5,426,008 A | 6/1995 | Hagiwara et al. | 430/18 |
| 5,532,296 A | 7/1996 | Recker et al. | 523/400 |
| 5,602,205 A | 2/1997 | Singh et al. | 525/282 |
| 5,627,222 A | 5/1997 | Recker et al. | 523/400 |
| 5,726,391 A | 3/1998 | Iyer et al. | 174/52.2 |
| 5,760,337 A | 6/1998 | Iyer et al. | 174/52.2 |
| 5,863,664 A | 1/1999 | McCormick et al. | 428/500 |

FOREIGN PATENT DOCUMENTS

| | | | |
|---|---|---|---|
| EP | 0 028 994 A2 | 5/1981 | H01L/23/28 |
| EP | 0 051 165 | 5/1982 | H01L/23/14 |
| EP | 3 357 110 | 3/1990 | C09D/151/00 |
| EP | 0 475 655 A2 | 3/1992 | C08K/9/10 |
| JP | 1-152174 | 12/1987 | C09D/5/44 |
| JP | 4-146984 | 5/1992 | C09J/133/08 |
| JP | 10168413 | 6/1998 | C09J/9/02 |
| WO | WO 96/07691 | 3/1996 | C08G/73/10 |
| WO | WO 97/18254 | 5/1997 | C08G/73/12 |

OTHER PUBLICATIONS

Mark A. Smith et al., "Bismaleimide/Vinyl Ether Matrix Copolymers", Department of Chemistry and Center for Macromolecular Science and Engineering, Univ. of Florida, Gainesville, FL (2 pgs.).
Carol K. Sauers, "The Dehydration of N–Arylmaleamic Acids with Acetic Anhydride", The Journal of Organic Chemistry, vol. 34, No. 8, Aug. 1969, pp. 2275–2279.
Robert J. Cotter et al., "The Synthesis of N–Substituted Isomaleimides", vol. 26, Jan. 1961, pp. 10–15.
Registry Copyright 2001 ACS RN 88229–22–5 Registry.
Cheng Hsiung Chang and Paul E. Fanta; Aziridines. XIX. Substituent Effects in the Pyrolytic Isomerization of 1–Aroyl–2,2–dimethylaziridines; J. Org. Chem., vol. 36, No. 25, 1971; pp. 3907–3910; Dept. of Chemistry, Illinois Institute of Technology, Chicago, Illinois 60616.

*Primary Examiner*—Helen L. Pezzuto
(74) *Attorney, Agent, or Firm*—Jane E. Gennaro

(57) ABSTRACT

This invention relates to underfill encapsulant compositions prepared from allylated amide compounds to protect and reinforce the interconnections between an electronic component and a substrate in a microelectronic device.

2 Claims, No Drawings

UNDERFILL ENCAPSULANTS PREPARED FROM ALLYLATED AMIDE COMPOUNDS

The priority of U.S. provisional application No. 60/091, 507 is claimed under 35 USC 119(e). Filing Date Jul. 2, 1998.

This application is a divisional of application Ser. No. 09/336,633 filing date Jun. 18, 1999 now U.S. Pat. No. 6,316,566.

FIELD OF THE INVENTION

This invention relates to underfill encapsulant compositions prepared from allylated amide compounds to protect and reinforce the interconnections between an electronic component and a substrate in a microelectronic device.

BACKGROUND OF THE INVENTION

Microelectronic devices contain millions of electrical circuit components, mainly transistors assembled in integrated circuit (IC) chips, but also resistors, capacitors, and other components. These electronic components are interconnected to form the circuits, and eventually are connected to and supported on a carrier or substrate, such as a printed wire board.

The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board.

Whether the component is a bare chip connected to a lead frame, or a package connected to a printed wire board or other substrate, the connections are made between electrical terminations on the electronic component and corresponding electrical terminations on the substrate. One method for making these connections uses metallic or polymeric material that is applied in bumps to the component or substrate terminals. The terminals are aligned and contacted together and the resulting assembly heated to reflow the metallic or polymeric material and solidify the connection.

During subsequent manufacturing steps, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent failure, the gap between the component and the substrate is filled with a polymeric encapsulant, hereinafter called underfill or underfill encapsulant, to reinforce the interconnect and to absorb some of the stress of the thermal cycling.

Two prominent uses for underfill technology are in packages known in the industry as flip-chip, in which a chip is attached to a lead frame, and ball grid array, in which a package of one or more chips is attached to a printed wire board.

The underfill encapsulation may take place after the reflow of the metallic or polymeric interconnect, or it may take place simultaneously with the reflow. If underfill encapsulation takes place after reflow of the interconnect, a measured amount of underfill encapsulant material will be dispensed along one or more peripheral sides of the electronic assembly and capillary action within the component-to-substrate gap draws the material inward. The substrate may be preheated if needed to achieve the desired level of encapsulant viscosity for the optimum capillary action. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

If underfill encapsulation is to take place simultaneously with reflow of the solder or polymeric interconnects, the underfill encapsulant, which can include a fluxing agent if solder is the interconnect material, first is applied to either the substrate or the component; then terminals on the component and substrate are aligned and contacted and the assembly heated to reflow the metallic or polymeric interconnect material. During this heating process, curing of the underrill encapsulant occurs simultaneously with reflow of the metallic or polymeric interconnect material.

For single chip packaging involving high volume commodity products, a failed chip can be discarded without significant loss. However, it becomes expensive to discard multi-chip packages with only one failed chip and the ability to rework the failed component would be a manufacturing advantage. Today, one of the primary thrusts within the semiconductor industry is to develop not only an underfill encapsulant that will meet all the requirements for reinforcement of the interconnect, but also an underfill encapsulant that will be reworkable, allowing for the failed component to be removed without destroying the substrate.

Conventional underfill technology uses low viscosity thermosetting organic materials, the most widely used being epoxy/anhydride systems. In order to achieve the required mechanical performance, relatively high molecular weight thermoplastics would be the preferred compositions for underfill materials. These materials, however, have high viscosity or even solid film form, which are drawbacks to the manufacturing process. Therefore, there is a need for new underfill encapsulant compositions that are easily dispensable to conform with automated manufacturing processes, and that are reworkable.

SUMMARY OF THE INVENTION

This invention relates to a curable underfill encapsulant compositions comprising allylated amide compounds, a free radical curing agent and/or a photoinitiator, and optionally, one or more fillers or other additives. The composition optionally may also contain mono- or polyfunctional vinyl compounds.

The composition can be designed to be reworkable by choosing a major amount of mono-functional compounds for the composition.

The ability to process these compositions for underfill encapsulants is achieved by using relatively low molecular weight reactive oligomers or prepolymers and curing them in situ after application to the electronic assembly. The relatively low molecular weight translates to a lower viscosity and ease of application to the substrate.

In another embodiment, this invention is a cured encapsulant composition that results after the curing of the just described curable underfill encapsulant composition.

In another embodiment, this invention is a microelectronic assembly comprising an electronic component having a plurality of electrical terminations, each termination electrically and mechanically connected by a metallic or polymeric material (the metallic or polymeric material also referred to herein as interconnect or interconnect material) to a substrate having a plurality of electrical terminations corresponding to the terminations of the electrical component, and a cured encapsulant disposed between the electrical component and the substrate to reinforce the solder or polymeric interconnects, in which the cured encapsulant was prepared from curing a composition comprising one or more allylated amide compounds, a free radical curing agent and/or a photoinitiator, and optionally, one or more fillers. The composition optionally may also contain mono- or polyfunctional vinyl compounds.

In another embodiment this invention is a method for making an electronic assembly, the electronic assembly comprising an electronic component having a plurality of electrical terminations, each termination electrically and mechanically connected by a metallic or polymeric material to a substrate having a plurality of electrical terminations corresponding to the terminations of the electrical component, and a cured reworkable underfill encapsulant composition disposed between the electronic component and the substrate, the method comprising: (a) providing a curable underfill encapsulant composition, (b) disposing the curable composition between the electrical component and the substrate; and (c) curing the composition in situ.

DETAILED DESCRIPTION OF THE INVENTION

The allylated amide, and vinyl compounds, used in the underfill encapsulant compositions of this invention are curable compounds, meaning that they are capable of polymerization, with or without crosslinking. As used in this specification, to cure will mean to polymerize, with or without crosslinking. Cross-linking, as is understood in the art, is the attachment of two polymer chains by bridges of an element, a molecular group, or a compound, and in general will take place upon heating. As cross-linking density is increased, the properties of a material can be changed from thermoplastic to thermosetting, which consequently increases polymeric strength, heat-and electrical resistance, and resistance to solvents and other chemicals.

It is possible to prepare polymers of a wide range of cross-link density, from tacky, elastomeric to tough glassy polymers, by the judicious choice and amount of mono- or polyfunctional compounds. The greater proportion of polyfunctional compounds reacted, the greater the cross-link density. If thermoplastic properties are desired, the underfill encapsulants of this invention can be prepared from monofunctional compounds to limit the cross-link density. However, a minor amount of poly-functional compounds can be added to provide some cross-linking and strength to the composition, provided the amount of poly-functional compounds is limited to an amount that does not diminish the desired thermoplastic properties. Within these parameters, the strength and elasticity of individual underfill encapsulants can be tailored to a particular end-use application.

The cross-link density can also be controlled to give a wide range of glass transition temperatures in the cured underfill to withstand subsequent processing and operation temperatures.

For those underfill encapsulants that are designed to be reworkable, the Tg is chosen to be below the reflow temperature of the metallic or polymeric interconnect. If the underfill is added after the reflow of the interconnect material, the low Tg will allow the encapsulant material to soften and adhere to both the electronic component and the substrate without affecting the interconnect.

If the underfill is added before the reflow, the same effect is achieved. The underfill encapsulant will soften and adhere to the electronic component and substrate during the reflow of the interconnect material. Intimate contact is maintained with the interconnect after the interconnect solidifies, imparting good stress transfer and long-term reliability.

In those cases where it is necessary to rework the assembly, the electronic component can be pried off the substrate, and any residue underfill can be heated until it softens and is easily removed.

In the inventive underfill encapsulant compositions, the allylated amide compounds, and vinyl compounds if used in combination with the allylated amide compounds, will be present in the curable underfill encapsulant compositions in an amount from 2 to 98 weight percent based on the organic components present (excluding any fillers).

The underfill encapsulant compositions will further comprise at least one free-radical initiator, which is defined to be a chemical species that decomposes to a molecular fragment having one or more unpaired electrons, highly reactive and usually short-lived, which is capable of initiating a chemical reaction by means of a chain mechanism. The free-radical initiator will be present in an amount of 0.1 to 10 percent, preferably 0.1 to 3.0 percent, by weight of the organic compounds present, excluding any filler. The free radical curing mechanism gives a fast cure and provides the composition with a long shelf life before cure. Preferred free-radical initiators include peroxides, such as butyl peroctoates and dicumyl peroxide, and azo compounds, such as 2,2'-azobis(2-methyl-propanenitrile) and 2,2'-azobis(2-methyl-butanenitrile).

Alternatively, the underfill encapsulant compositions may contain a photoinitiator in lieu of the free-radical initiator, and the curing process may then be initiated by UV radiation. The photoinitiator will be present in an amount of 0.1 to 10 percent, preferably 0.1 to 3.0 percent, by weight of the allylated amide compound, or combination of both allylated amide and vinyl compounds, present (excluding any filler). In some cases, both photoinitiation and free-radical initiation may be desirable. For example, the curing process can be started by UV irradiation, and in a later processing step, curing can be completed by the application of heat to accomplish a free-radical cure.

In general, these compositions will cure within a temperature range of 50° to 250° C., and curing will be effected within a length of time of less than one minute to four hours. As will be understood, the time and temperature curing profile for each adhesive composition will vary, and different compositions can be designed to provide the curing profile that will be suited to the particular industrial manufacturing process.

Ease of application, even when thermoplastic properties are desired for the underfill encapsulant, is achieved by using relatively low molecular weight reactive oligomers or pre-polymers and curing these in situ after application to the electronic assembly of component and substrate. Applying the materials in an uncured state gives high processibility, and the resultant cured thermoplastic encapsulant provides high mechanical performance.

For some underfill operations, inert inorganic fillers are used in the underfill encapsulant to adjust the coefficient of thermal expansion to more closely mirror that of the circuit interconnect, and to mechanically reinforce the interconnect. Examples of suitable thermally conductive fillers include silica, graphite, aluminum nitride, silicon carbide, boron nitride, diamond dust, and clays. The fillers will be present typically in an amount of 20–80 percent by weight of the total underfill encapsulant composition.

Allylated Amide Compounds

The allylated amide compounds suitable for use in the compositions of this invention have a structure represented by the formulas A and B as depicted here:

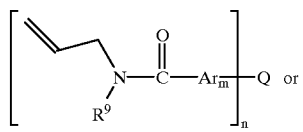
(A)

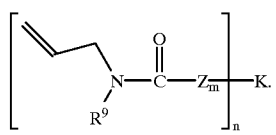
(B)

As used throughout this specification, the notation C(O) refers to a carbonyl group. For these specific formulae, when lower case "n" is the integer 1, the compound will be a mono-functional compound; and when lower case "n" is an integer 2 to 6, the compound will be a poly-functional compound.

Formula A represents those compounds in which:

$R^9$ is H, an alkyl or alkyleneoxy group having 1 to 18 carbon atoms, allyl, aryl, or substituted aryl having the structure

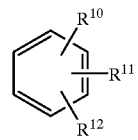

in which $R^{10}$, $R^{11}$, and $R^{12}$ are independently H or an alkyl or alkyleneoxy group having 1 to 18 carbon atoms;

each Ar independently is an aromatic group selected from the aromatic groups having the structures (I) through (V):

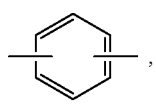
(I)

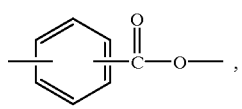
(II)

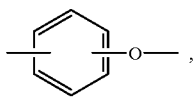
(III)

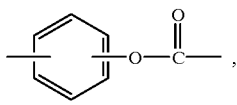
(IV)

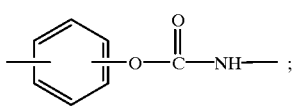
(V)

and Q is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to X;

or Q is a urethane having the structure:

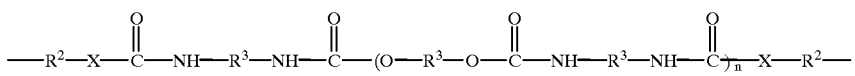

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Q is an ester having the structure:

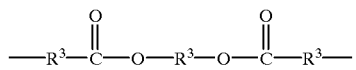

in which $R^3$ is an alkyl or alkyloxy chain having up to 100 atoms in the chain, which chain may contain aryl substituents;

or Q is a siloxane having the structure:
—$(CR^1_2)_e$—$[SiR^4_2$—$O]_f$—$SiR^4_2$—$(CR^1_2)_g$— in which the $R^1$ substituent independently for each position is H or an alkyl group having 1 to 5 carbon atoms and the $R^4$ substituent independently for each position is an alkyl group having 1 to 5 carbon atoms or an aryl group, and e and g are independently 1 to 10 and f is 1 to 50; and m is 0 or 1, and n is 1 to 6.

Formula B represents those compounds in which $R^9$ is H, or an alkyl or alkyleneoxy group having 1 to 18 carbon atoms, or an allyl group, or an aryl or substituted aryl having the structure

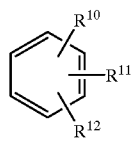

in which $R^{10}$, $R^{11}$, and $R^{12}$ are independently H or an alkyl or alkyleneoxy group having 1 to 18 carbon atoms;

Z is a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to K;

or Z is a urethane having the structure:

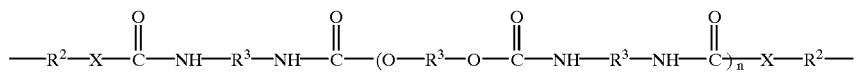

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Z is an ester having the structure:

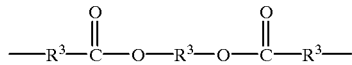

in which $R^3$ is an alkyl or alkyloxy chain having up to 100 atoms in the chain, which chain may contain aryl substituents;

or Z is a siloxane having the structure:

—$(CR^1{}_2)_e$—$[SiR^4{}_2$—$O]_f$—$SiR^4{}_2$—$(CR^1{}_2)_g$— in which the $R^1$ substituent independently for each position is H or an alkyl group having 1 to 5 carbon atoms and the $R^4$ substituent independently for each position is an alkyl group having 1 to 5 carbon atoms or an aryl group, and e and g are independently 1 to 10 and f is 1 to 50;

K is an aromatic group selected from the aromatic groups having the structures (VI) through (XIII) (although only one bond may be shown to represent connection to the aromatic group K, this will be deemed to represent any number of additional bonds as described and defined by n):

(VI)

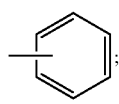

-continued (VII)

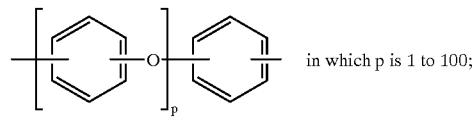

in which p is 1 to 100;

(VIII)

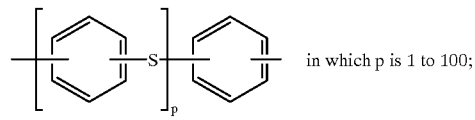

in which p is 1 to 100;

(IX)

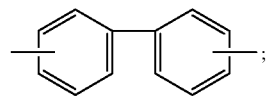

-continued (X)

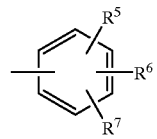

in which $R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring; or $R^5$, $R^6$, and $R^7$ are a siloxane having the structure —$(CR^1{}_2)_e$—$[SiR^4{}_2$—$O]_f$—$SiR^4{}_2$—$(CH_3)_g$— in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 0 to 50;

(XI)

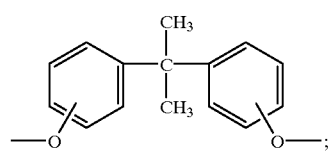

-continued

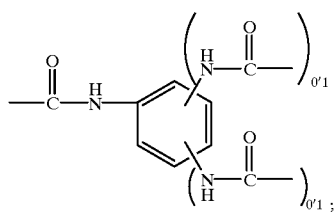
(XII)

and

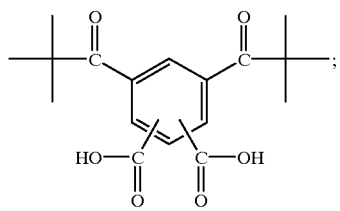
(XIII)

and m is 0 or 1 and n is 1 to 6.

Vinyl Compounds

The compounds suitable for use in the adhesive compositions of this invention have a structure represented by one of the formulae:

$[M—Ar_m]_n—Q$ or $[M—Z_m]_n—K$, in which m is 0 or 1, and n is 1 to 6.

M represents a vinyl group and can be the maleimide moiety having the structure:

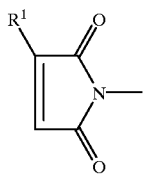

in which $R^1$ is H or $C_1$ to $C_5$ alkyl; or or the vinyl moiety having the structure:

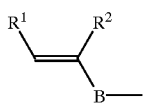

in which $R^1$ and $R^2$ are H or an alkyl having 1 to 5 carbon atoms, or together form a 5 to 9 membered ring with the carbons forming the vinyl group; B is C, S, N, O, C(O), O—C(O), C(O)—O, C(O)NH or C(O)N($R^8$), in which $R^8$ is $C_1$ to $C_5$ alkyl. Preferably, B is O, C(O), O—C(O), C(O)—O, C(O)NH or C(O)N($R^8$); more preferably B is O, C(O), O—C(O), C(O)—O, or C(O)N($R^8$).

Ar independently is an aromatic group selected from the aromatic groups having the structures (I) through (V):

(I)

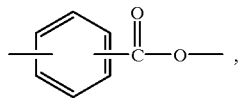
(II)

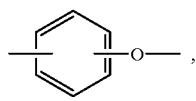
(III)

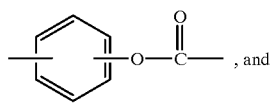
(IV)

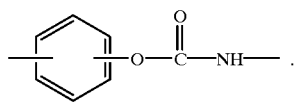
(V)

Preferably, Ar is structure (II), (III), (IV) or (V), and more preferably is structure (II).

Q and Z independently can be a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to X;

or Q and Z independently can be a urethane having the structure:

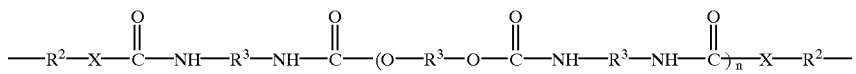

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; X is O, S, N, or P; and n is 0 to 50;

or Q and Z independently can be an ester having the structure:

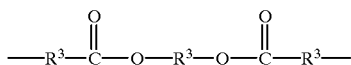

in which $R^3$ is an alkyl or alkyloxy chain having up to 100 atoms in the chain, which chain may contain aryl substituents;

or Q and Z independently can be a siloxane having the structure: $-(CR^1{}_2)_e-[SiR^4-O]_f-SiR^4{}_2-(CR^1{}_2)_g$ in which the $R^1$ substituent independently for each position is H or an alkyl group having 1 to 5 carbon atoms and the $R^4$ substituent independently for each position is an alkyl group having 1 to 5 carbon atoms or an aryl group, and e and g are independently 1 to 10 and f is 1 to 50.

Preferably, Q and Z will be a linear or branched chain alkyl, alkyloxy, alkylene, or alkyleneoxy species having up to about 100 atoms in the chain, as described with pendant saturated or unsaturated cyclic or heterocyclic substituents, or a siloxane as described, and more preferably is a linear or branched chain alkyl species or siloxane, as described.

K is an aromatic group selected from the aromatic groups having the structures (VI) through (XIII) (although only one bond may be shown to represent connection to the aromatic group K, this will be deemed to represent any number of additional bonds as described and defined by n):

(VI)

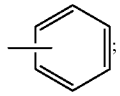

(VII)

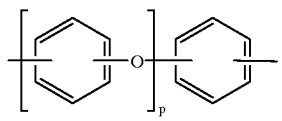

in which p is 1 to 100;

(VIII)

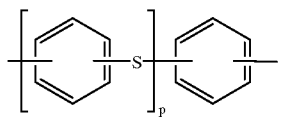

in which p is 1 to 100;

(IX)

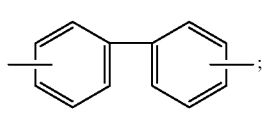

(X)

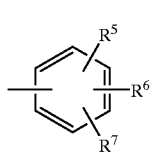

in which $R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteroatom present may or may not be directly attached to the aromatic ring or $R^5$, $R^6$, and $R^7$ are a siloxane having the structure $-(CR^1{}_2)_e-[SiR^4{}_2-O]_f-SiR^4{}_2-(CH_3)_g-$ in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 0 to 50;

(XI)

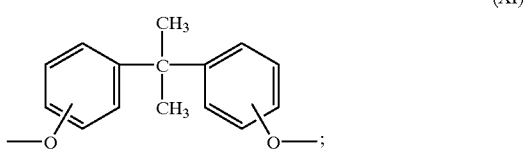

(XII)

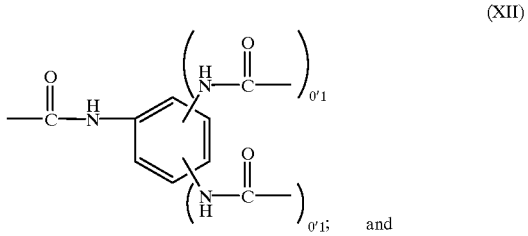

and (XIII)

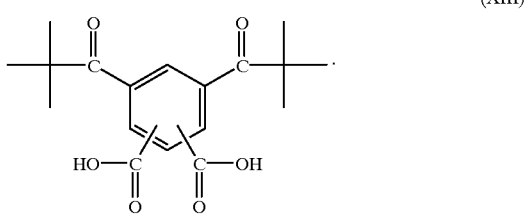

Preferably, K is structure (VIII), (X) or (XI), more preferably is structure (X) or (XI), and most preferably is structure (X).

Other Composition Components

Depending on the nature of the substrate, the composition may also contain a coupling agent. A coupling agent as used herein is a chemical species containing a polymerizable functional group for reaction with the maleimide and other vinyl compound, and a functional group capable of condensing with metal hydroxides present on the surface of the substrate. Such coupling agents and the preferred amounts for use in compositions for particular substrates are known in the art. Suitable coupling agents are silanes, silicate esters, metal acrylates or methacrylates, titanates, and compounds containing a chelating ligand, such as phosphine, mercaptan, and acetoacetate. When present, coupling agents typically will be in amounts up to 10 percent by weight, and preferably in amounts of 0.1–3.0 percent by weight, of the maleimide and other monofunctional vinyl compound.

In addition, the compositions may contain compounds that lend additional flexibility and toughness to the resultant cured composition. Such compounds may be any thermoset or thermoplastic material having a Tg of 50° C. or less, and typically will be a polymeric material characterized by free rotation about the chemical bonds, such as can be obtained by the presence of carbon-carbon double bonds adjacent to carbon-carbon single bonds, the presence of ester and ether groups, and the absence of ring structures. Suitable such modifiers include polyacrylates, poly(butadiene), polyTHF (polymerized tetrahydrofuran), CTBN (carboxy-terminated butyronitrile) rubber, and polypropylene glycol. When present, toughening compounds may be in an amount up to about 15 percent by weight of the maleimide and other monofunctional vinyl compound.

Siloxanes may also be added to the compositions to impart elastomeric properties. Suitable siloxanes are the methacryloxypropyl-terminated polydimethyl siloxanes, and the aminopropyl-terminated polydimethylsiloxanes, available from United Chemical Technologies.

The composition may also contain organic fillers, such as, polymers to adjust rheology. Other additives known and used in the art may also be used for specific purposes, such as, adhesion promoters. The selection of the types and amounts suitable is within the expertise of one skilled in the art.

EXAMPLE 1

Preparation of Bis Phenol F—Bis(diallylamide)

The intermediate isolated above (508.8 g, 1 mol) is dissolved in THF (1 L) and $H_2O$ (1 L) in a 3 L three-necked flask equipped with mechanical stirrer, reflux condenser and internal temperature probe under nitrogen. To this solution is added $KMnO_4$ (316 g, 2 mol), and the resulting mixture warmed to 80° C. for 5 hours. The reaction is allowed to cool to room temperature and bulk solvent is removed in vacuo. The resulting material is solvated in $CH_2Cl_2$ (1 L), filtered, and washed with $H_2O$ (3×1 L). The isolated organics are dried over $MgSO_4$ and solvent removed in vacuo to yield a diacid intermediate.

The above diacid (544.8 g, 1 mol) is combined with diallylamine (194.3 g, 2 mol) and $CH_2Cl_2$ (1 L) in a 3 L three-necked flask equipped with a mechanical stirrer, addition funnel and internal temperature probe under nitrogen. The solution is cooled to 4° C. in an ice bath. The addition funnel is charged with dicyclohexylcarbodiimide (DCC)

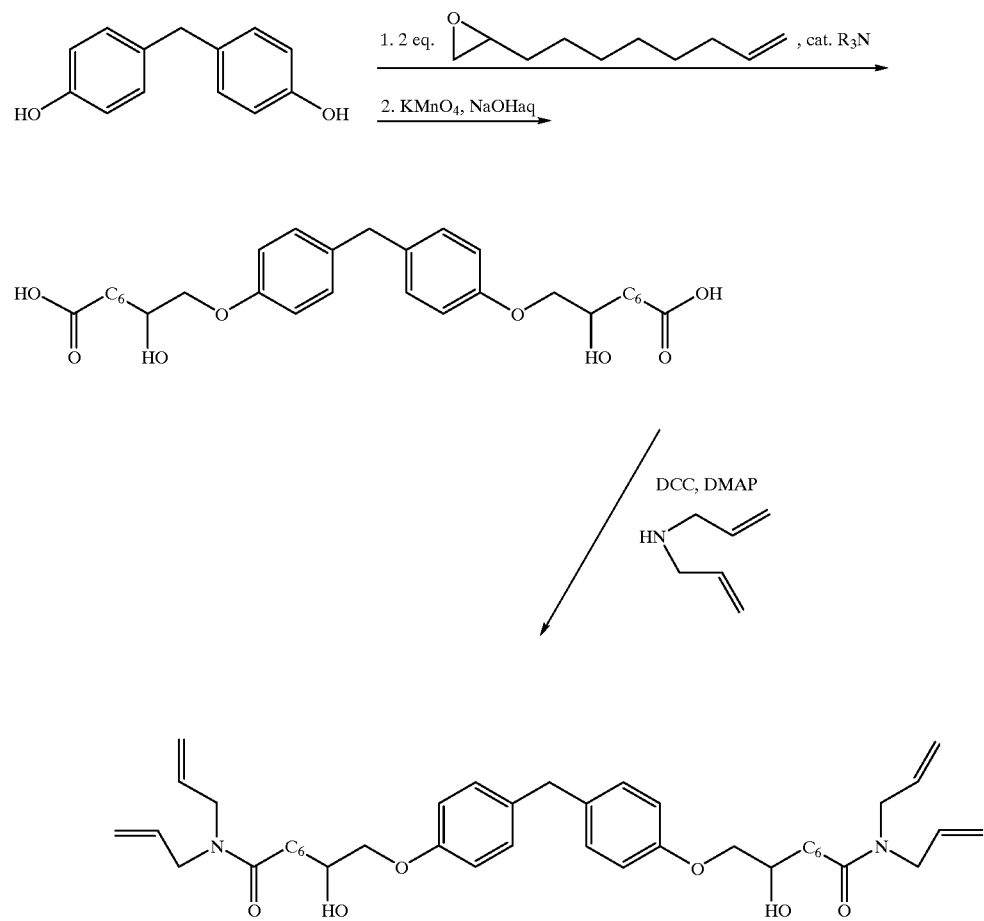

Bisphenol F (200.3 g, 1 mol) is solvated in tetrahydrofuran (THF) (500 mL) in a 2 L three-necked flask equipped with mechanical stirrer and reflux condenser. To this solution is added 1,2-epoxy-9-decene (308.5 g, 2 mol) and benzyldimethylamine (0.67 g, 5 mmol). The solution is warmed to 80° C. for 7 hours and then allowed to cool to room temperature. Solvent is removed in vacuo to yield an oil.

(412.7 g, 2 mol) dissolved in $CH_2Cl_2$ (300 mL), and this solution added to the stirred amine solution over the course of 60 minutes. The reaction is stirred on the ice bath for an additional 30 minutes. The mixture is allowed to warm to room temperature and further stirred for 4 hours. The solution is filtered to remove precipitated dicyclohexylurea (DCU). The isolated organics are dried over $MgSO_4$ anhyd., filtered and solvent removed in vacuo to yield the bis(diallylamide) product.

EXAMPLE 2

Preparation of Poly(butadiene)bis(diallylamide)

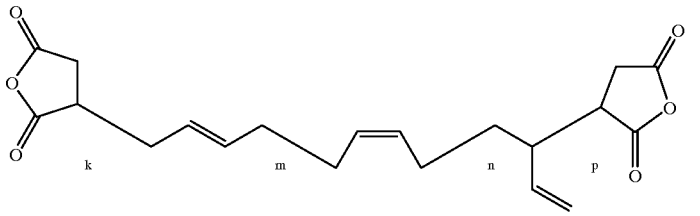

Ricon 131MA12

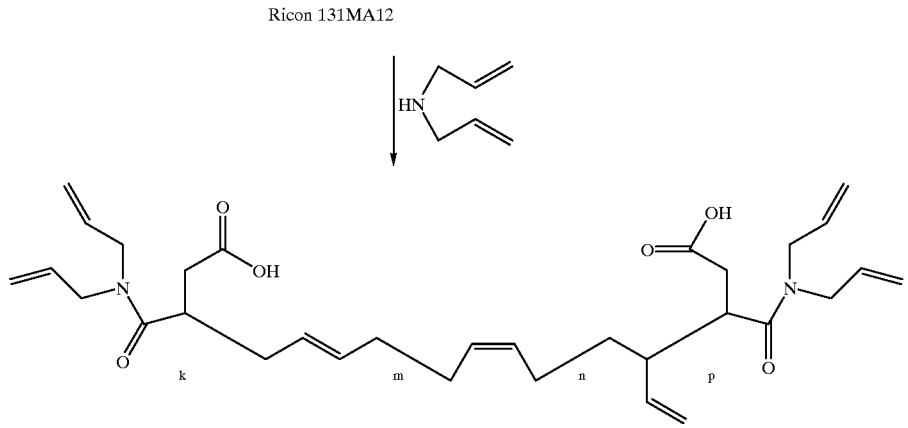

Diallylamine (97.15 g, 1 mol) is solvated in acetone (500 mL) in a 2 L three-necked flask equipped with mechanical stirrer, addition funnel and internal temperature probe under nitrogen. The solution is cooled on an ice bath. Maleinized poly(butadiene) (Ricon 131MA5, Ricon Resins Inc., 1766 g) dissolved in acetone (500 mL) is charged into the addition funnel and added to the cooled amine solution over the course of 60 minutes maintaining an internal temperature<10° C. The solution is stirred on ice for an additional 60 minutes, then allowed to warm to room temperature and stirred for another 2 hours. Solvent and residual diallylamine are removed in vacuo to yield the poly(diallylamide).

EXAMPLE 3

Preparation of Dimer Bis(diallylamide) or 10,11-Dioctyl-1,20-eicosyl bis(diallylamide)

Dimer acid (sold under the trademark Empol 1024 by Unichema, 20.5 g, 35.7 mmol) was solvated in anhydrous toluene (250 mL) in a 500 mL four-necked flask equipped with reflux condenser, addition funnel, and magnetic stirring under nitrogen. This solution was warmed to 80° C., and oxalyl chloride (12.5 mL, 143 mmol) was added dropwise over the course of 60 minutes. Evolution of $CO_2$, CO and HCl was immediately evident. The reaction was stirred for an additional 3 hours after the addition was complete, allowed to cool to room temperature and solvent removed in vacuo to yield an orange oil. IR and $^1H$ NMR spectral data were consistent with the desired bis(acid chloride) product.

Diallyl amine (10.0 mL) was solvated in diethyl ether ($Et_2O$) (200 mL) in a 500 mL three-necked flask equipped with mechanical stirrer, addition funnel and internal temperature probe under nitrogen. NaOH (3.2 g, 80 mmol) dissolved in $H_2O$ (100 mL) was added to this solution. This solution was cooled to 4° C. on an ice bath. The bis(acid chloride) described above was solvated in $Et_2O$ (20 mL), charged into the addition funnel and added to the stirred amine solution over the course of 30 minutes, maintaining an internal temperature<10° C. This solution was stirred on ice for an additional one hour, then allowed to warm to room temperature, and stirred for an additional 4 hours. The organic layer was isolated and washed with 5% $HCl_{aq}$ (200 mL), and $H_2O$ (2×200 mL). The isolated organics were dried over $MgSO_4$ anhydrous, filtered, and the solvent removed in vacuo to yield an orange oil (87%), which exhibited IR and $^1H$ NMR spectral data consistent with the desired bis(diallylamide).

EXAMPLE 4

Preparation of Palmitoyl allylamide

Monoallylamide is prepared from allyl amine (57.1 g, 1 mol), palmitoyl chloride (274.9 g, 1 mol) and NaOH (40 g, 1 mol) using the Schotten-Baumenn conditions described above for the synthesis of Example 3.

EXAMPLE 5

Allylamide/BMI Die Attach Adhesive

The following reagents were combined and manually mixed to yield a homogenous die attach composition:

| | |
|---|---|
| Azeloylbis(diallylamide) (prepared from azeloyl dichloride and diallylamine utilizing the same general procedure as in Example 3) | 0.521 g |
| Bismaleimide, sold as Versalink P-650 by Henkel | 1.678 g |

| | -continued | |
|---|---|---|
| t-Butyl-2-ethylhexanoate | 0.043 g | |
| Metal diacrylate (sold as product number 633 by Sartomer) | 0.023 g | |
| γ-Methacryloxypropyl-trimethoxysilane | 0.024 g | |
| Silver powder from Chemet Corporation, RA-0081 | 5.148 g | |

The adhesive was used to bond a 80×80 mil silicon die to various metal leadframes as listed below (Ag/Alloy 42 indicates silver coated Alloy 42, an Fe/Ni alloy; Ag/Cu indicates silver coated copper). Die Shear Strength was measured using an HMP Model 1750 die shear tester with digital force gauge DFI 50 (Chatillon) at room temperature (RDSS, room die shear strength) and at 240° C. (HDSS, hot die shear strength) after curing for 60 seconds on a 200° C. hotplate (condition 1), and after curing for 60 seconds on a 200° C. hotplate followed by 4 hours in a 175° C. oven (condition 2). The results are reported here and show commercially acceptable die shear values.

| | Cure Condition 1 | | Cure Condition 2 | |
|---|---|---|---|---|
| Leadframe | RDSS | HDSS | RDSS | HDSS |
| Ag/Alloy 42 | 1.72 | 0.87 | 5.65 | 0.92 |
| Ag/Cu | 2.15 | 0.58 | 4.65 | 0.74 |
| Cu | 1.76 | 0.48 | 3.60 | 0.85 |
| Pd | 1.94 | 1.18 | 4.56 | 1.25 |

EXAMPLE 6

Preparation of Benzamido-endcapped Dimer Diamine Bismaleimide

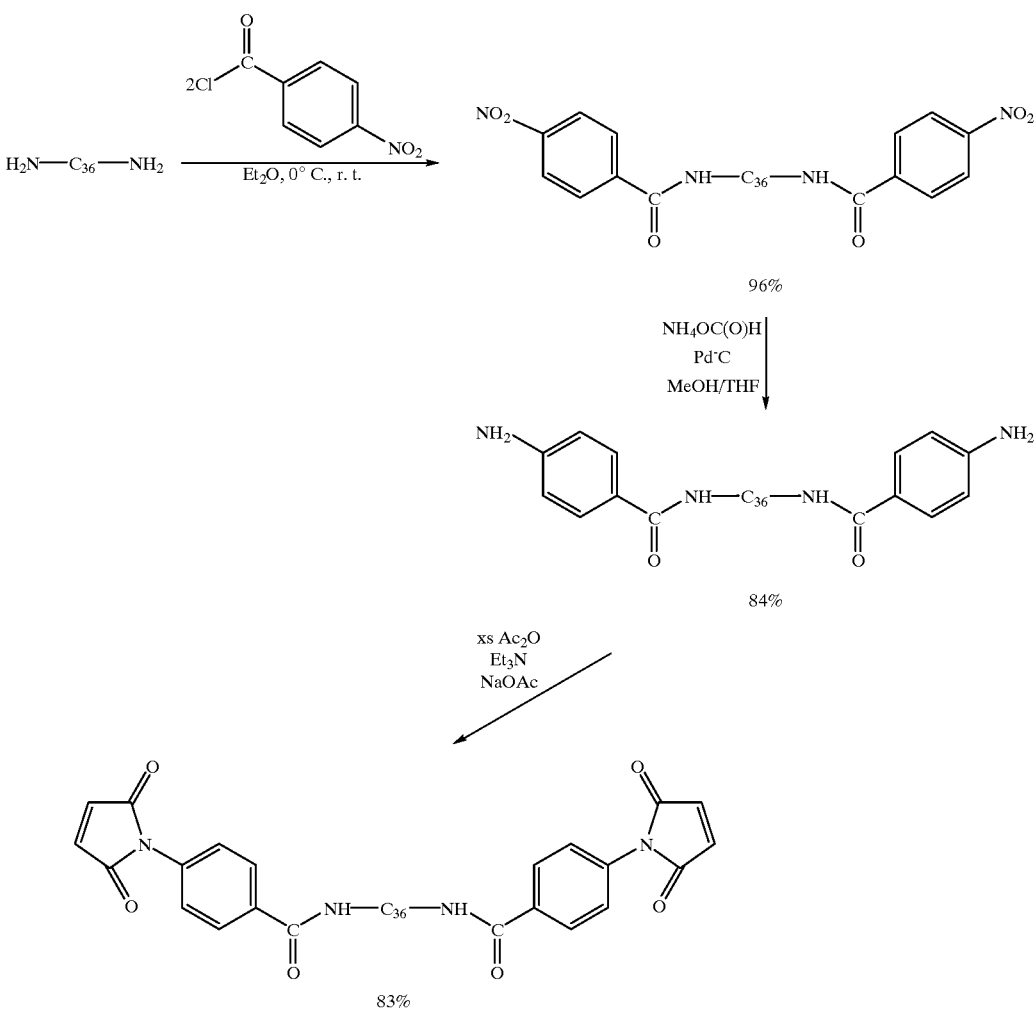

Dimer diamine (sold as Versamine 552 by Henkel, 20.0 g, 37 mmol) was solvated in diethyl ether ($Et_2O$) (200 mL) in a 500 mL three-necked flask equipped with an addition funnel, magnetic stirring, internal temperature probe and nitrogen inlet/outlet. $NaOH_{aq}$ (11.7 mL of 6.25 M solution diluted with 100 mL $H_2O$, 73 mmol) was added with vigorous stirring. This solution was placed under a steady flow of nitrogen and cooled to 3° C. on an ice bath with stirring. The addition funnel was charged with p-nitrobenzoyl chloride (13.6 g, 73 mmol) in $Et_2O$ (50 mL), and this solution was added to the reaction vessel over the course of 60 minutes, maintaining an internal T<10° C. The reaction was stirred at ~3° C. for an additional 60 minutes after this addition was complete, then allowed to warm to room temperature and stirred for another 4 hours. The solution was transferred to a separatory funnel and the isolated organic layer washed with distilled H$_2$O (300 mL), 5% HCl$_{aq}$ (300 mL), NaCl$_{aq}$ (250 mL) and distilled H$_2$O (2×250 mL). The organics were isolated, dried over MgSO$_4$ anhyd., filtered and the solvent removed in vacuo to yield the dinitro compound as a viscous yellow oil which exhibited acceptable $^1$H NMR and IR spectra (30.0 g, 96%).

The dinitro compound described above (5.0 g, 5.9 mmol) was dissolved in methanol (MeOH) (25 mL) and tetrahydrofuran (THF) (5 mL) in a 250 mL three-necked flask equipped with magnetic stirring, reflux condenser and nitrogen inlet/outlet. The solution was placed under nitrogen, and 5% Pd-C (0.96 g) were added with stirring. Ammonium formate (3.4 g, 55 mmol) was added and the reaction stirred at room temperature for 2 hours. Carbon dioxide evolution was immediately observed. The reaction solution was filtered, and bulk filtrate solvent was removed via rotary evaporator. The resulting viscous oil was dissolved in Et$_2$O (150 mL), washed with distilled H$_2$O (150 mL), isolated and dried over MgSO$_4$ anhyd. Solvent was removed in vacuo to yield the diamine as a sticky tan oil, which exhibited acceptable $^1$H NMR and IR spectra (3.9 g, 84%).

Maleic anhydride (0.5 g, 5.1 mmol) was dissolved in acetone (10 mL) in a 250 mL three-necked flask equipped with magnetic stirring, addition funnel and nitrogen inlet/outlet. The solution was cooled on an ice bath and placed under nitrogen. The addition funnel was charged with an acetone (10 mL) solution of the diamine described above (2.0 g, 2.60 mmol), which was added dropwise over 30 minutes. The reaction was stirred for an additional 30 minutes on the ice bath, then allowed to warm to room temperature, and stirred for another 4 hours. To the resulting slurry was added acetic anhydride (Ac$_2$O) (1.54 mL, 160 mmol), triethyl amine (Et$_3$N) (0.23 mL, 1.63 mmol) and sodium acetate (NaOAc) (0.16 g, 1.9 mmol). The resulting slurry was heated to mild reflux for 5 hours. The reaction was allowed to cool to room temperature, and solvent removed via rotary evaporator to yield a brown oil. This material was dissolved in CH$_2$Cl$_2$ (250 mL) and washed with distilled H$_2$O (200 mL), satd. NaHCO$_3$ (200 mL) and distilled H$_2$O (200 mL). Emulsions were broken by adding NaCl when necessary. The organic layer was isolated, dried over MgSO$_4$ anhyd. and solvent removed in vacuo to yield the bismaleimide, a brown solid (2.0 g, 83%). The resin exhibited satisfactory $^1$H NMR, $^{13}$C NMR and IR spectra, which indicated slight contamination with acetic acid.

EXAMPLE 7

Preparation of 20-Bismaleimido-10,11-dioctyl-eicosame (and isomers)

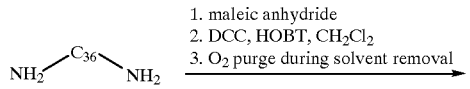

1. maleic anhydride
2. DCC, HOBT, CH$_2$Cl$_2$
3. O$_2$ purge during solvent removal -continued

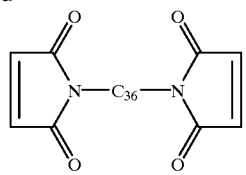

In a 5 L multi-neck flask equipped with a drying tube, thermometer, slow addition funnel, mechanical stirrer and nitrogen purge maleic anhydride (98.06 g, 1.02 equivalents on —NH$_2$) was dissolved in 500 ml tetrahydrofuran (THF). Stirring was begun and the solution was chilled with a dry ice/water bath. Slow addition of dimer diamine (Versamine 552, Henkel, 245.03 g, 0.4477 mol) in 250 ml THF was begun. Addition was carried out over 1 hour. After addition was complete the ice bath was removed and 375 ml of THF was rinsed through the slow addition funnel to incorporate solidified diamine. After one hour the ice bath was replaced around the flask. 1-Hydroxy-benzotriazole (96.79 g, 0.80 equivalents on —NH$_2$) was added rinsing into the flask with 50 ml THF. When the temperature had reached 5° C. slow addition of dicyclohexylcarbodiimide (DCC) (188.43 g, 1.02 equivalents on —NH$_2$) in 200 ml THF was begun. The temperature during addition was kept below ten degrees. After DCC addition was complete the slow addition funnel was rinsed with 80 ml of THF. The ice bath was removed. The reaction was monitored by IR. When it appeared that the isoimide has been converted to maleimide (approximately 4 hours after the completion of DCC addition) the mixture was filtered, rinsing the solids with THF. The orange solution was placed in the freezer overnight.

The solution was removed from the freezer and allowed to warm to room temperature. Hydroquinone (0.0513 g) was added to the solution. A partial strip of the THF was carried out on a rotary evaporator with the temperature maintained below 28° C. The solution was concentrated to approximately 800 ml. Much particulate matter was visible. The solution was placed in freezer overnight.

The mixture was removed from the freezer and allowed to warm. The solids were filtered, rinsing with THF. The filtrate was transferred to a 2 L multi-neck flask equipped with a mechanical stirrer, vacuum line connected to a trap, and a glass tube attached by tubing to a drying tube. The remaining THF was stripped at room temperature by pulling a vacuum and bubbling air through the material while stirring. The resultant thick, creamy-tan colored semi-solid was placed in the freezer overnight.

The semi-solid was removed from the freezer and allowed to warm. The semi-solid was dissolved in 450 ml each of methanol and hexane, and washed with 50% methanol/water (4×250 ml) to remove 1-hydroxybenzotriazole (HOBT). It was attempted to extract the product with hexane. After addition of 300 ml of hexane separation was not observed. The mixture was washed with additional water (3×250 ml). The organic phase was placed in the freezer overnight.

The material was removed from the freezer. Two layers were apparent. The upper layer was clear and yellow in color. The bottom layer was a orange and cloudy. The material was poured cold into a separatory funnel. The top layer was hexane and the desired product. The bottom layer was extracted with hexane (6×200 ml), separation occurred easily. The combined extracts were dried over anhydrous magnesium sulfate and filtered, rinsing the solids with hexane. The solvent was stripped to an approximate volume of 750 ml on a rotary evaporator with the temperature not exceeding 24° C. The remaining solvent was stripped off using a vacuum/air bubbling set-up at room temperature to give the desired product in 67% yield.

EXAMPLE 8

Preparation of Butadiene-Acrylonitrile Bismaleimide

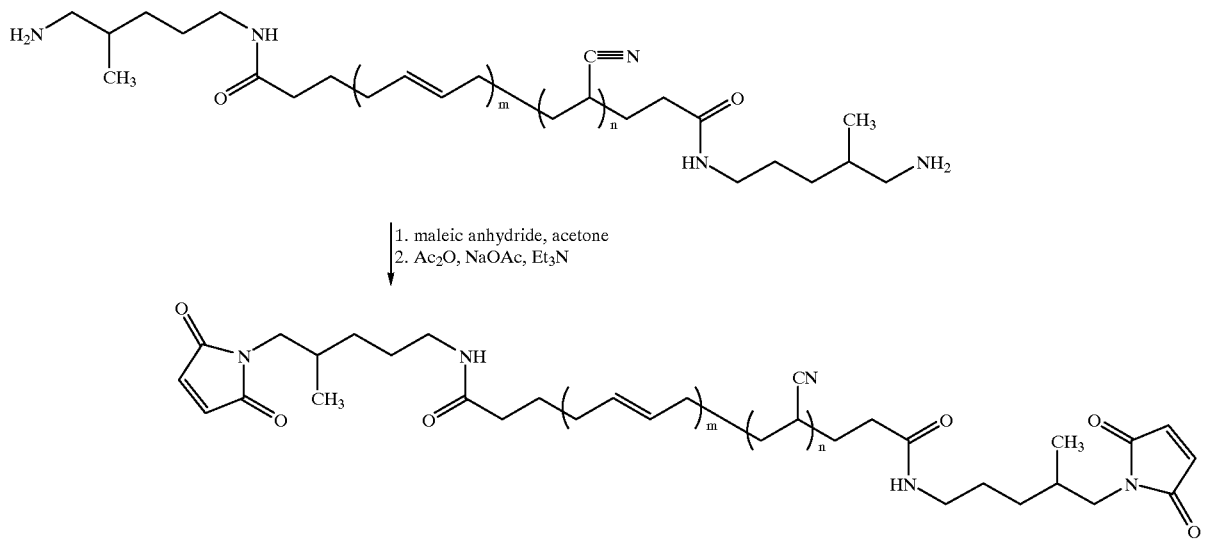

Amino-terminated butadiene-acrylonitrile (sold as Hycar resin 1300 X42 ATBN by BF Goodrich, in which the m and n depicted in the structure are intergers to provide a number average molecular weight of 3600) (450 g, 500 mmol based on amine equivalent weight AEW=450 g) was dissolved in $CHCl_3$ (1000 mL) in a 3 L four-necked flask equipped with addition funnel, mechanical stirrer, internal temperature probe and nitrogen inlet/outlet. The stirred solution was placed under nitrogen and cooled on an ice bath. The addition funnel was charged with maleic anhydride (98.1 g, 1 mol) in $CHCl_3$ (50 mL) and this solution was added to the reaction over 30 minutes, maintaining the internal reaction temperature below 10° C. This mixture was stirred for 30 minutes on ice, then allowed to warm to room temperature and stirred for an additional 4 hours. To the resulting slurry was added acetic anhydride ($Ac_2O$) (653.4 g, 6 mol), triethyl amine ($Et_3N$) (64.8 g, 0.64 mol) and sodium acetate (NaOAc) (62.3 g, 0.76 mol). The reaction was heated to mild reflux for 5 hours, allowed to cool to room temperature, and subsequently extracted with $H_2O$ (1 L), satd. $NaHCO_3$ (1 L) and $H_2O$ (2×1 L). Solvent was removed in vacuo to yield the maleimide terminated butadiene acrylonitrile.

EXAMPLE 9

Preparation of Tris(maleimide) Derived From Tris (epoxypropyl)isocyanurate

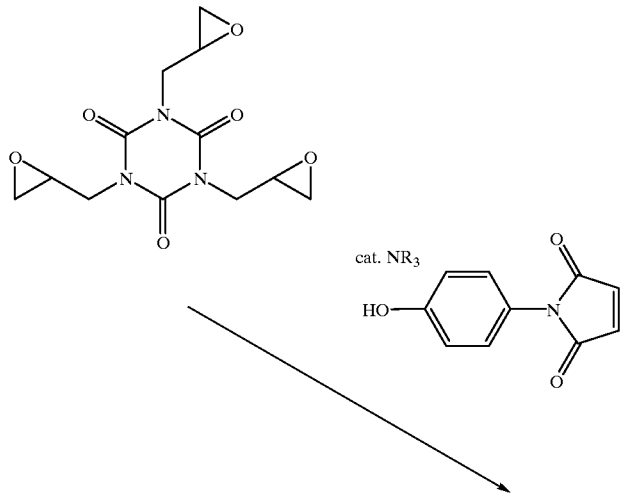

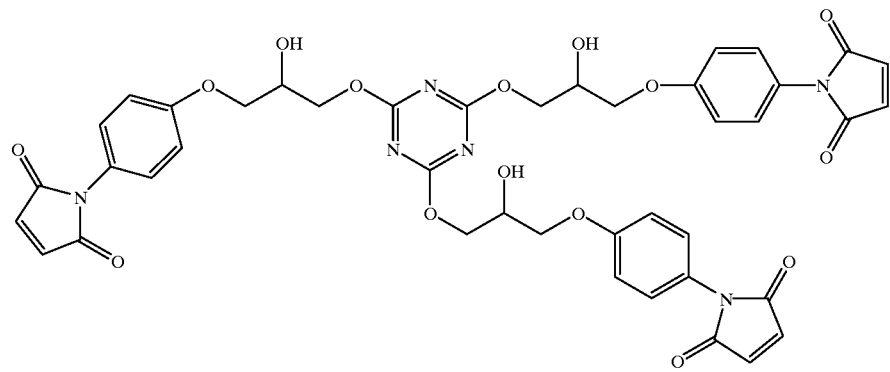

Tris(epoxypropyl)isocyanurate (99.0 g, 0.33 mol) is dissolved in THF (500 mL) in a 2 L three-necked flask equipped with mechanical stirrer, internal temperature probe and nitrogen inlet/outlet. To this solution is added hyroxyphenylmaleimide (189.2 g, 1 mol) and benzyldimethylamine (1.4 g, 0.05 wt %). The solution is heated to 80° C. for 7 hours. The reaction then is allowed to cool to room temperature, is filtered, and the filtrant washed with 5% $HCl_{aq}$ (500 mL) and distilled $H_2O$ (1 L). The resulting solid, triazinetris(maleimide), is vacuum dried at room temperature.

EXAMPLE 10

Preparation of Maleimidoethylpalmitate

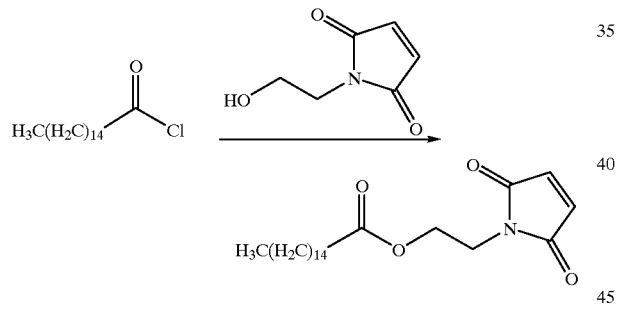

Palmitoyl chloride (274.9 g, 1 mol) is dissolved in $Et_2O$ (500 mL) in a 2 L three-necked flask equipped with mechanical stirrer, internal temperature probe, addition funnel and nitrogen inlet/outlet. $NaHCO_3$ (84.0 g, 1 mol) in distilled $H_2O$ (500 mL) is added with vigorous stirring and the solution cooled on an ice bath under nitrogen. The addition funnel is charged with hydroxyethylmaleimide (141 g, 1 mol) in $Et_2O$ (100 mL) and this solution added to the reaction over a period of 30 minutes, maintaining an internal T<10° C. during the addition. The reaction is stirred for another 30 minutes on ice, then allowed to warm to room temperature and stirred for 4 hours. The reaction is transferred to a separatory funnel and the isolated organic layer washed with distilled $H_2O$ (500 mL), 5% $HCl_{aq}$ (500 mL) and distilled $H_2O$ (2×500 mL). The organics are isolated, dried over $MgSO_4$ anhyd., filtered and solvent removed in vacuo to yield the aliphatic maleimide.

EXAMPLE 11

Preparation of Bismaleimide Derived from 5-Isocyanato-1-(isocyanatomethyl)-1,3,3-trimethylcyclohexane

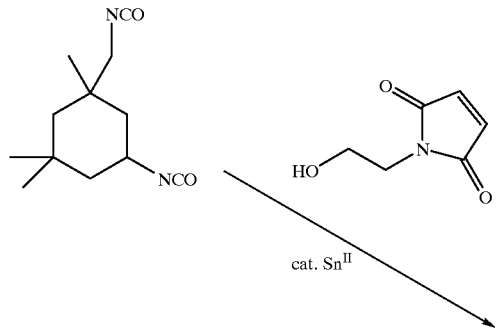

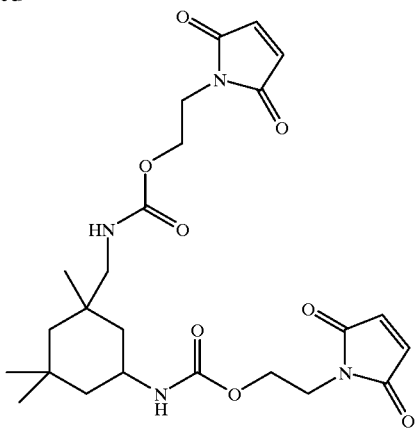

5-Isocyanato-1-(isocyanatomethyl)-1,3,3-trimethylcyclohexane (111.15 g, 0.5 mol) is solvated in THF (500 mL) in a 1 L three-necked flask equipped with mechanical stirrer, addition funnel and nitrogen inlet/outlet. The reaction is placed under nitrogen, and dibutyltin dilaurate (cat. $Sn^{II}$) (6.31 g, 10 mmol) and hydroxyethylmaleimide (141 g, 1 mol) are added with stirring, and the resulting mixture heated for 4 hours at 70° C. The addition funnel is charged with hydroxyethylmaleimide (141 g, 1 mol) dissolved in THF (100 mL). This solution is added to the isocyanate solution over 30 minutes, and the resulting mixture heated for an additional 4 hours at 70° C. The reaction is allowed to cool to room temperature and solvent removed in vacuo. The remaining oil is dissolved in $CH_2Cl_2$ (1 L) and washed with 10% $HCl_{aq}$ (1 L) and distilled $H_2O$ (2×1 L). The isolated organics are dried over $MgSO_4$, filtered and the solvent removed in vacuo to yield the maleimide.

EXAMPLE 12

Preparation of Dimer Divinyl Ether Derived From Pripol 2033

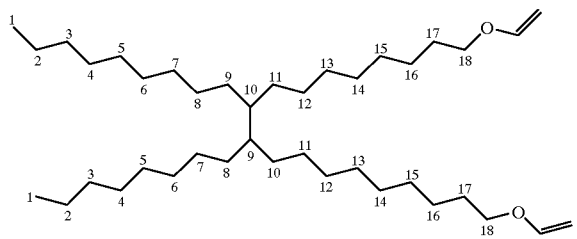

"Dimer Divinyl Ether" (and Cyclic Isomers)

Bis(1,10-phenanthroline)Pd(OAc)$_2$ (0.21 g, 0.54 mmol) was dissolved in a mixture of butyl vinyl ether (8.18 g, 81.7 mmols), heptane (100 mL) and "dimer diol" (sold as Pripol 2033 by Unichema, 15.4 g, 27.2 mmol) in 2 L three-necked flask equipped with a mechanical stirrer under nitrogen. This solution was heated to light reflux for 6 h. The solution was allowed to cool to room temperature and subsequently poured onto activated carbon (20 g) and stirred for 1 hour. The resulting slurry was filtered, and excess butyl vinyl ether and heptane were removed in vacuo to yield the divinyl ether as a yellow oil. The product exhibited acceptable $^1$H NMR, FT-IR and $^{13}$C NMR spectral characteristics. Typical viscosity ~100 cPs.

EXAMPLE 13

Preparation of Dimer Diacrylate Derived From Dimer Diol (Pripol 2033)

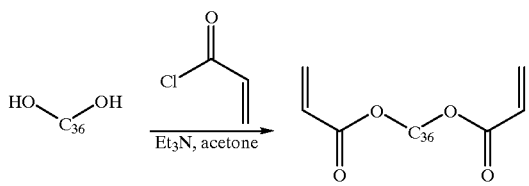

A dimer diol (sold as Pripol 2033 by Unichema, 284.4 g, 500 mmol) is dissolved in dry acetone (500 mL) in a 1 L three-necked flask equipped with mechanical stirrer, addition funnel and internal temperature probe under nitrogen. Triethylamine (101.2 g, 1 mol) is added to this solution and the solution cooled to 4° C. on an ice bath. Acryloyl chloride (90.5 g, 1 mol) solvated in dry acetone (100 mL) is charged into the addition funnel and added to the stirred reaction solution over the course of 60 minutes, maintaining an internal temperature<10° C. This solution is stirred on ice for an additional 2 hours, then allowed to warm to room temperature and stirred for 4 hours. Bulk solvent is removed via a rotary evaporator, and the remaining residue solvated in $CH_2Cl_2$ (1 L). This solution is washed with 5% $HCl_{aq}$ (800 mL), and $H_2O$ (2×800 mL). The isolated organics are dried over $MgSO_4$ anhyd. and filtered, and the solvent removed in vacuo to yield the diacrylate as an oil.

EXAMPLE 14

Preparation of N-ethylphenyl Maleimide

4-Ethyl aniline (12.12 g) was dissolved in 50 ml of anhydrous ethyl ether and slowly added to a stirred solution of 9.81 g of maleic anhydride in 100 ml of anhydrous ethyl ether chilled in an ice bath. After completion of the addition, the reaction mixture was stirred for 30 minutes. The light yellow crystals were filtered and dried. Acetic anhydride (200 ml) was used to dissolve the maleamic acid and 20 g of sodium acetate. The reaction mixture was heated in an oil bath at 160° C. After 3 hours of reflux, the solution was cooled to room temperature, placed in a 1 L beaker in ice water and stirred vigorously for 1 hour. The product was suction-filtered and recrystallized in hexane. The collected

EXAMPLE 15

Preparation of Bis(alkenylsulfide)

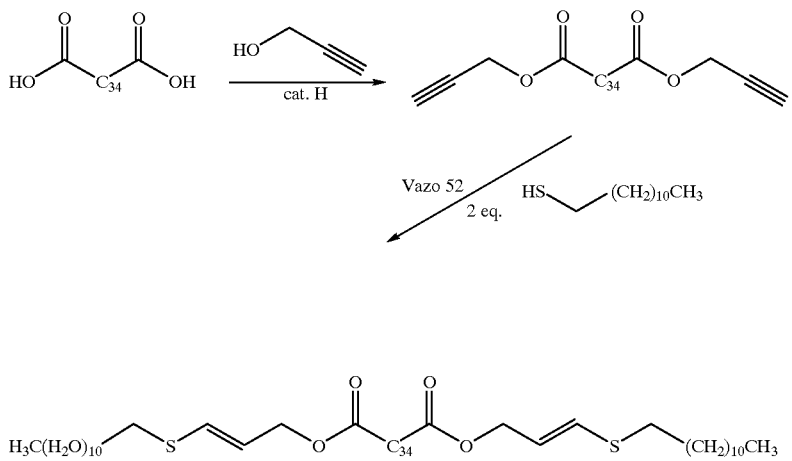

Dimer acid (sold under the trademark Empol 1024 by Unichema) (574.6 g, 1 mol) and propargyl alcohol (112.1 g, 2 mol) are solvated in toluene (1 L) in a 3 L three-necked flask equipped with mechanical stirring and a Dean-Stark distillation apparatus. Concentrated $H_2SO_4$ (6 mL) is added and the solution refluxed for 6 hours until 36 mL of $H_2O$ is azeotropically distilled. The solution is allowed to cool to room temperature, is washed with $H_2O$ (2×1 L), dried over $MgSO_4$ anhyd. and the solvent removed in vacuo to yield the propargyl ester intermediate as an oil.

This ester intermediate (650.7 g, 1 mol) is solvated in THF (200 mL) in a 1 L three-necked flask equipped with reflux condensor, mechanical stirrer and internal temperature probe under nitrogen. Lauryl mercaptan (404.8 g, 2 mol) and 2,2'-azobis(2,4-dimethylpentanenitrile) (sold under the trademark Vazo 52 by DuPont) (11 g) are added and the resulting mixture heated to 70° C. on an oil bath with stirring for 7 hours. The reaction is allowed to cool to room temperature and solvent removed in vacuo to yield the alkenyl sulfide as an oil.

EXAMPLE A

Preparation of 6-maleimidocaproic acid

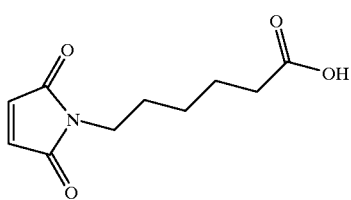

6-maleimidocaproic acid

The acid functional maleimide, 6-maleimidocaproic acid, was synthesized using known methodology. [1]Aminocaproic acid (100 g, 7.6×10$^{-1}$ mols) was dissolved in glacial acetic acid (50 mL) in a 500 mL four-necked flask equipped with mechanical stirring, an internal temperature probe and an addition funnel. The addition funnel was charged with a solution of maleic anhydride (74.8 g, 7.6×10$^{-1}$ mols) dissolved in acetonitrile (75 mL). This solution was added to the aminocaproic acid at room temperature dropwise over 1 hour, maintaining an internal reaction temperature less than 35° C. The reaction was stirred for three hours after the addition was complete. The reaction slurry was filtered, and the isolated filtrate was dried in a vacuum oven (P~25 T) overnight at 70° C. to yield 166 g of off white solid (95%). The product amic acid exhibited FT-IR and $^1$H NMR spectral characteristics consistent with literature data.

The amic acid described above (166 g, 7.2×10$^{-1}$ mols) was solvated in a solution of toluene (200 mL), benzene (200 mL) and triethylamine (211 mL, 1.51 mol) in a 1 L three-necked flask equipped with mechanical stirring and a Dean-Stark trap under nitrogen. This solution was heated to reflux for 4 h and the water produced collected in the Dean-Stark trap. Distilled water (400 mL) was added to the reaction flask to dissolve the triethylammonium salt of the product which largely separated from the bulk solution during the reaction. This aqueous layer was isolated, acidified to pH~1 with 50% HCl, and extracted with ethyl acetate (600 mL). This organic layer was washed with distilled water (400 mL). The isolated organic layer was dried over $MgSO_4$, followed by solvent removal in vacuo to yield an off white solid (76.2 g, 50%). The product 6-maleimidocaproic acid was spectrographically identical to literature material by FT-IR and $^1$H NMR.

crystalline material was dried at 50° C. in a vacuum oven overnight. FTIR and NMR analysis showed the characteristics of ethyl maleimide.

EXAMPLE B

Preparation of "Dimer Diester Bismaleimide"

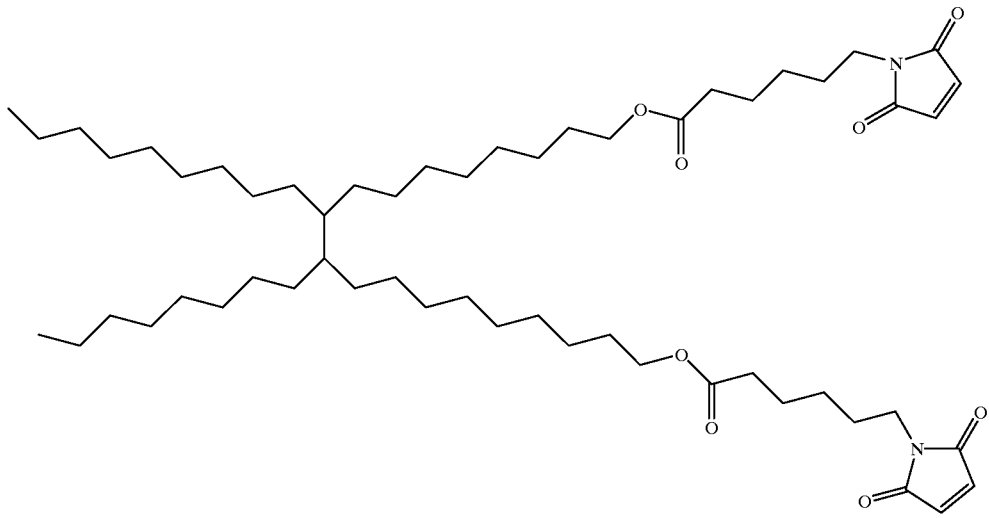

"Dimer Diester Bismaleimide" (and cyclic isomers)

Pripol 2033 ("dimer diol", Uniqema, 92.4 g, $1.69 \times 10^{-1}$ mols), 6-maleimidocaproic acid (75.0 g, $3.55 \times 10^{-1}$ mols) and $H_2SO_4$ (0.50 mL, $\sim 8.5 \times 10^{-1}$ mols) were slurried in toluene (300 mL) in a 1 L four-necked flask equipped with mechanical stirrer, a Dean-Stark trap and an internal temperature probe under nitrogen. The reaction was heated to light reflux for two hours and the water evolved collected in the Dean-Stark trap. The trap was drained and ~50 mL of toluene solvent was distilled off of the reaction to remove trace moisture and drive the esterification equilibrium to completion. The reaction was allowed to cool to room temperature, additional toluene (100 mL) was added (on the laboratory scale it is preferable to add diethyl ether in place of toluene at this point), and the solution was washed with saturated $NaHCO_3$aq. (300 mL) and distilled water (300 mL). The organic layer was isolated and dried over anhydrous $MgSO_4$, and the solvent removed in vacuo to yield an orange oil (107.2 g, 68%). The material can be further purified by eluting a toluene solution of the resin through a short plug of silica or alumina. This liquid bismaleimide resin exhibited acceptable FT-IR, $^1H$ NMR, and $^{13}C$ NMR data. Typical $\eta \sim 2500$ cPs.

EXAMPLE C

Preparation of "Decane Diol Diester Bismaleimde"

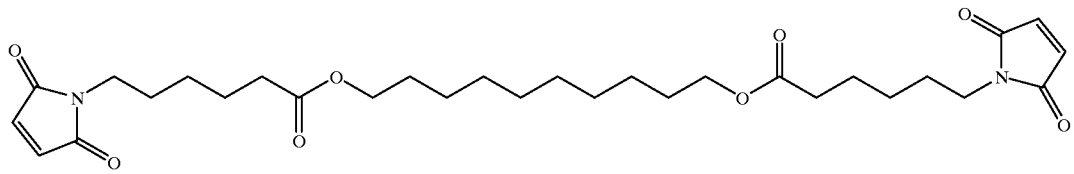

"Decane Diol Diester Bismaleimide"

The general procedure described in Example B was applied substituting decane diol (29.5 g, 1.69×10⁻¹ mols) for Pripol 2033. This process yielded a solid, moderately soluble bismaleimide (54.9 g, 58%). The product exhibited satisfactory FT-IR and $^1$H NMR data.

EXAMPLE D

Preparation of "Glycerol Triester Tris(maleimide)"

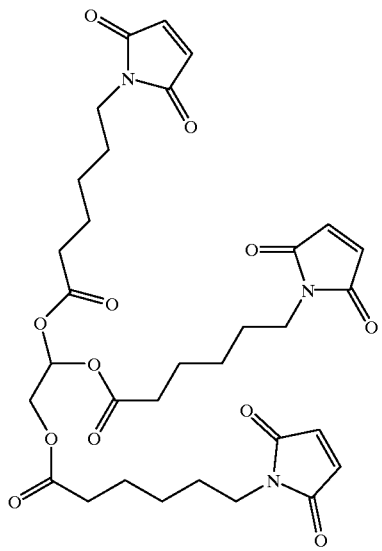

The protocol outlined in example B was utilized substituting glycerol (10.4 g, 1.13×10⁻¹ mol) for Pripol 2033. The product was a viscous liquid which exhibited acceptable FT-IR and $^1$H NMR data.

EXAMPLE E

Preparation of "Bis(m-nitrobenzyl carbamate) of IPDI"

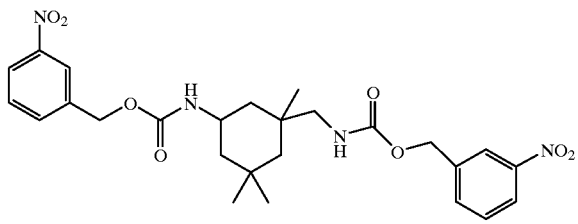

"Bis(m-nitrobenzyl carbamate) of IPDI"

Isophorone diisocyanate ("IPDI", 100.0 g, 4.5×10⁻¹ mols), m-nitrobenzyl alcohol (137.8 g, 9.0×10⁻¹ mols) and dibutyl tin dilaurate (2.8 g, 4.5×10⁻³ mols) were solvated in dry toluene (1500 mL) in a 2 L three-necked flask equipped with mechanical stirrer, reflux condensor and internal temperature probe under nitrogen. The resulting solution was heated to 90° C. for 4 h. No isocyanate band was observed in the IR of the solids portion of the sample. The solution was allowed to cool to room temperature and washed with distilled H$_2$O (100 mL). The organic layer was isolated and solvent removed in vacuo to yield a yellow liquid which exhibited acceptable FT-IR and $^1$H NMR characteristics.

EXAMPLE F

Preparation of "Bis(m-aminobenzyl carbamate) of IPDI"

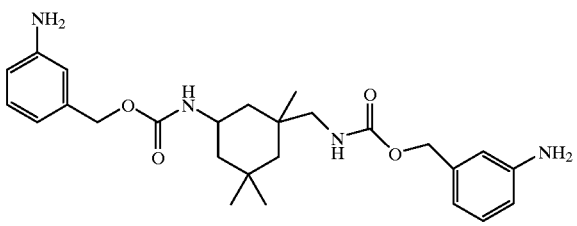

"Bis(m-aminobenzyl carbamate) of IPDI"

The dinitro compound from Example E (8.28 g, 1.57×10⁻² mols) was dissolved in ethanol (100 mL) in a 500 mL three-necked round bottom flask equipped with magnetic stirring under nitrogen. Cyclohexene (28.6 mL, 2.82×10⁻¹ mols) was added, followed by 5% Pd/C (4.14 g). The resulting slurry was refluxed lightly for 6.5 h. The FT-IR of a filtered aliquot of this solution exhibited no nitro stretching bands at 1529 cm⁻¹ and 1352 cm⁻¹. The bulk solution was allowed to cool to room temperature and filtered. Solvent was removed in vacuo to yield a yellow semisolid (6.6 g, 90%) which exhibited acceptable FT-IR and $^1$H NMR spectral characteristics.

EXAMPLE G

Preparation of "Bis(m-maleimidobenzyl carbamate) of IPDI"

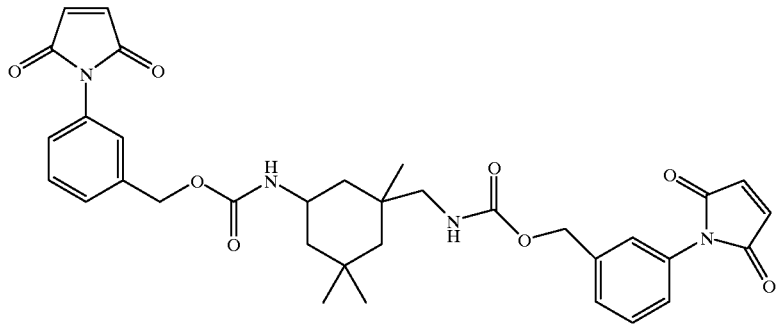

"Bis(m-maleimidobenzyl carbamate) of IPDI"

The diamine from Example F (6.6 g, 1.41×1$^{-2}$ mols) was solvated in acetone (60 mL) in a 250 mL four-necked flask equipped with magnetic stirrer and addition funnel under nitrogen and cooled to 4° C. Maleic anhydride (2.76 g, 2.82×10$^{-2}$ mols) dissloved in acetone (20 mL) was added over the course of 30 minutes. The resulting solution was stirred at 4° C. for for 1 h, and subsequently was allowed to warm to room temperature and stirred overnight. FT-IR analysis indicated no maleic anhydride remained as judged by the absence of the anhydride stretching band at ~1810 cm$^{-1}$.

To the above amic acid solution was added acetic anhydride (8.5 mL, 9.0×10$^{-2}$ mols), triethylamine (1.26 mL, 9.0×10$^{-3}$ mols) and sodium acetate (0.88 g, 1.1×10$^{-2}$ mols). The resulting solution was refluxed lightly for 4 h under nitrogen. The reaction was allowed to cool to room temperature and bulk solvent was removed in vacuo. The resulting viscous liquid was resolvated in methylene chloride (200 mL) and extracted with distilled water (3×200 mL). The organics were then dried over MgSO$_4$ anhyd., filtered and solvent removed in vacuo to yield a light brown solid (6.75 g, 76%). This material exhibited acceptable FT-IR and $^1$H NMR spectral features.

EXAMPLE H

Preparation of "Bis(m-nitrobenzyl carbamate) of DDI 1410"

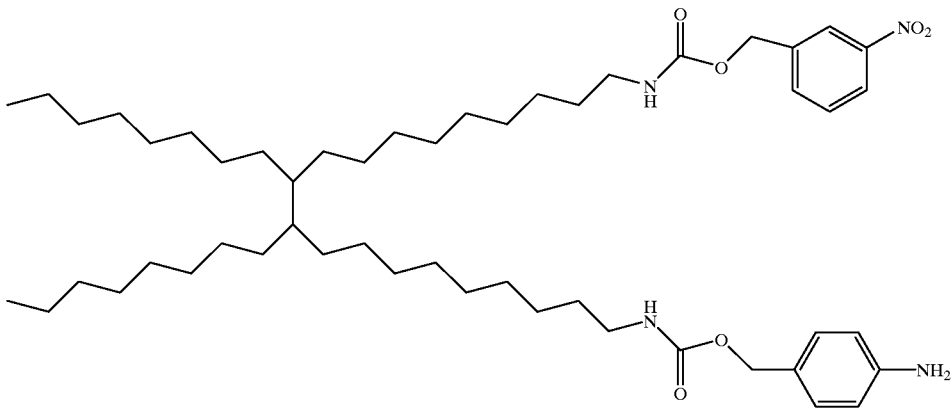

"Bis(m-nitrobenzyl carbamate) of DDI 1410" (and cyclic isomers)

DDI 1410 (Henkel, "Dimer Diisocyanate", 99.77 g, 1.65× 10$^{-1}$ mols based on 13.96% NCO), m-nitrobenzyl alcohol (50.8 g, 3.32×10$^{-1}$ mols) and dibutyltin dilaurate (0.5 mL, 8.3×10$^{-4}$ mols) were solvated in toluene (150 mL) in a 1 L four-necked flask equipped with mechanical stirrer, reflux condensor and internal temperature probe under nitrogen. The reaction was heated to 85° C. for 2.5 h. FT-IR analysis of an aliquot of the reaction indicated complete consumption of isocyanate functionality as judged by the lack of a band at 2272 cm$^{-1}$. Solvent was removed from the reaction in vacuo to yield a yellow oil which solidified upon standing at room temperature (152.4 g, 102% (trace toluene)). This solid exhibited satisfactory FT-IR and $^1$H NMR spectral features.

EXAMPLE I

Preparation of "Bis(m-aminobenzyl carbamate) of DDI 1410"

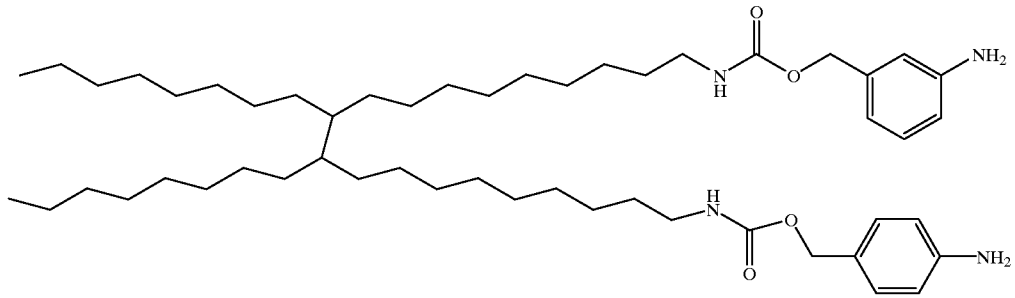

"Bis(m-aminobenzyl carbamate) of DDI 1410" (and cyclic isomers)

The diamine product of Example H (39.6 g, 4.32×10$^{-2}$ mols) and stannous chloride dihydrate (97.55 g, 4.32×10$^{-1}$ mols) were slurried in ethyl acetate (300 mL) in a 1 L three-necked flask equipped with mechanical stirrer and a reflux condenser under nitrogen. The reaction was heated to light reflux and stirred vigorously for 3 h. The solution was allowed to cool to room temperature and brought to pH 7–8 with a solution of saturated sodium bicarbonate. The mixture was pushed through a 25 micron filter to yield a mixture which separated into a cloudy aqueous layer and a moderately clear organic layer. The aqueous layer was isolated and washed with ethyl acetate (100 mL). The organic layers were combined, washed with distilled water (300 mL) and dried over anhydrous MgSO$_4$. The slurry was filtered and solvent removed from the filtrate in vacuo to yield yellow, sticky solid (33.8 g, 92%).

EXAMPLE J

Preparation of "Bis(m-maleimidobenzyl carbamate) of DDI 1410"

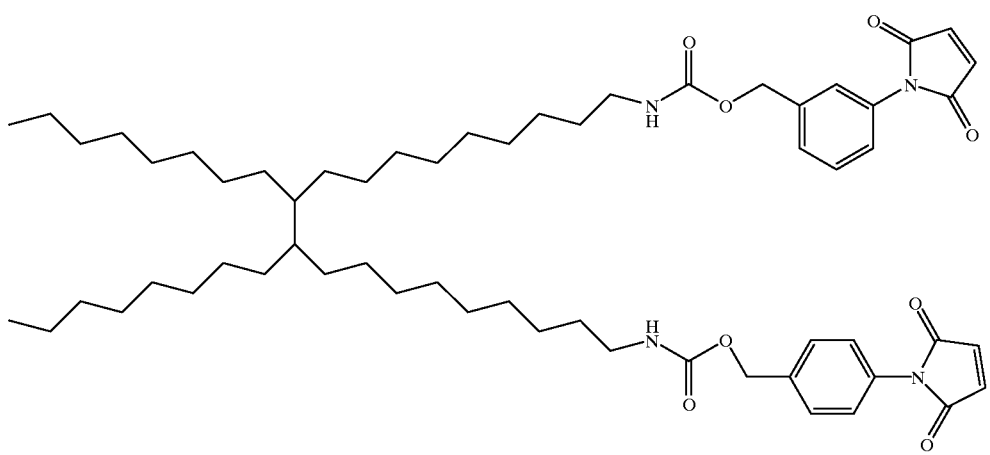

"Bis(m-maleimidobenzyl carbamate) of DDI 1410" (and cyclic isomers)

Maleic anhydride (15.4 g, 1.57×10$^{-2}$ mols) was dissolved in acetone (300 mL) in a 2 L four-necked flask equipped with mechanical stirrer, internal temperature probe and addition funnel under nitrogen. This solution was cooled to ~4° C. on an ice bath. A solution of the diamine prepared in Example I (63.4 g, 7.48×10$^{-2}$ mols) in acetone (70 mL) was charged to the addition funnel and added to the maleic anhydride solution over a period of 30 minutes maintaining an internal temperature of <10° C. The resulting solution was stirred for 1 h and subsequently allowed to warm to room temperature and stir for 2 h.

To this solution of amic acid was added acetic anhydride (24.7 mL, 2.62×10$^{-1}$ mols), triethylamine (6.25 mL, 4.48×10$^{-2}$ mols) and manganese acetate tetrahydrate (0.37 g, 1.50×10$^{-3}$ mols). This solution was heated to light reflux for 6.5 h, then allowed to cool to room temperature. Bulk solvent was removed in vacuo, and the resulting dark liquid was dissolved in diethyl ether (500 mL). This solution was washed with dist. H$_2$O (500 mL). The isolated organic layer was then washed with saturated NaHCO$_3$ aq. (500 mL) and again with dist. H$_2$O (500 mL). The organics were isolated, dried over anhyd. MgSO$_4$, and solvent removed in vacuo to yield a viscous orange oil. This material exhibited FT-IR, $^1$H NMR and $^{13}$C NMR spectral features consistent with the expected bismaleimide product.

Another embodiment of this invention includes the underfill encapsulants containing the allylated amide compounds having the structures:

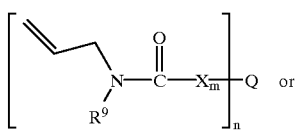

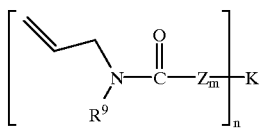

as described herein, in which Q and Z can be an ester having the structure

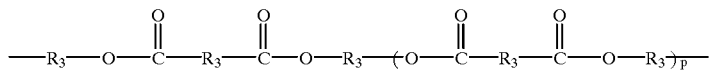

or the structure

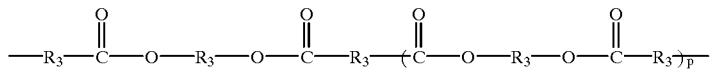

in which p is 1 to 100, each R$^3$ can independently be an alkyl or alkyloxy chain having up to 100 atoms in the chain, which chain may contain aryl substituents, or a siloxane having the structure —(CR$^1_2$)$_e$—[SiR$^4_2$—O]$_f$—SiR$^4_2$—(CR$^1_2$)$_g$— in which the R$^1$ substituent independently for each position is H or an alkyl group having 1 to 5 carbon atoms, the R$^4$ substituent independently for each position is an alkyl group having 1 to 5 carbon atoms or an aryl group, e and g are independently 1 to 10 and f is 1 to 50.

Another embodiment of this invention includes the maleimides having the formulae [M—X$_m$]$_n$—Q and [M—Z$_m$]$_n$—K as described herein in which Q and Z can be an ester having the structure

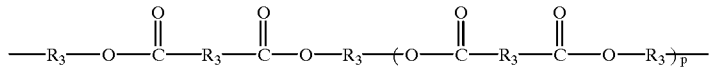

or the structure

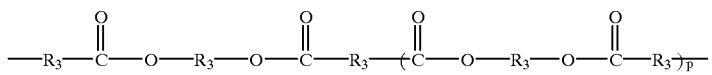

in which p is 1 to 100,
- each $R^3$ can independently be an alkyl or alkyloxy chain having up to 100 atoms in the chain, which chain may contain aryl substituents, or
- a siloxane having the structure $—(CR^1{}_2)_e—[SiR^4{}_2—O]_f—SiR^4{}_2—(CR^1{}_2)_g—$ in which the $R^1$ substituent independently for each position is H or an alkyl group having 1 to 5 carbon atoms, the $R^4$ substituent independently for each position is an alkyl group having 1 to 5 carbon atoms or an ayl group, e and g are independently 1 to 10 and f is 1 to 50.

Another embodiment of this invention includes the vinyl compounds having the structures

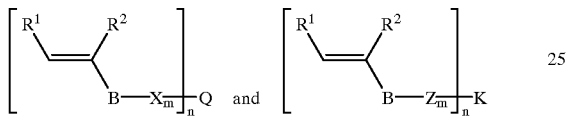

as described herein in which B is C, S, N, O, C(O), C(O)NH or C(O)N($R^8$), in which $R^8$ is $C_1$ to $C_5$ alkyl.

Another embodiment of this invention includes the vinyl compounds having the structures

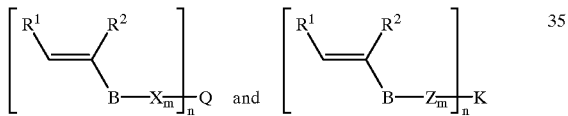

as described herein in which Q and Z can be an ester having the structure

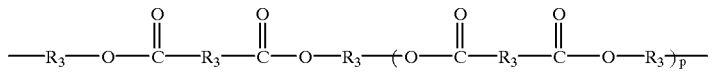

or the structure

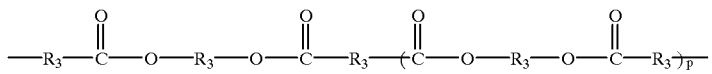

in which p is 1 to 100,
each $R^3$ can independently be an alkyl or alkyloxy chain having up to 100 atoms in the chain, which chain may contain aryl substituents,
or a siloxane having the structure
$—(CR^1{}_2)_e—[SiR^4{}_2—O]_f—SiR^4{}_2—(CR^1{}_2)_g—$ in which the $R^4$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50.

Another embodiment of this invention includes the underfill encapsulant as described herein containing an anionic or cationic curing initiator. The types and useful amounts of such initiators are well known in the art.

What is claimed is:

1. An underfill encapsulant comprising an allylated amide compound; a curing initiator selected from the group consisting of a free-radical initiator, a photoinitiator, and a combination of those; optionally, one or more fillers; optionally, one or more adhesion promoters;

the allylated amide compound having the formula

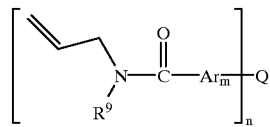

in m is 0 or 1, n is 1 to 6, and
(a) $R^9$ is H, an alkyl group having 1 to 18 carbon atoms, an alkyleneoxy group having 1 to 18 carbon atoms; aryl, or substituted aryl having the structure

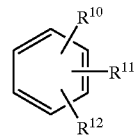

in which $R^{10}$, $R^{11}$, and $R^{12}$ are independently H or an alkyl or alkyleneoxy group having 1 to 18 carbon atoms;
(b) Q is an aromatic group selected from the group of aromatic groups having the structures:

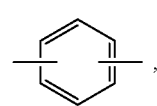

(I)

-continued

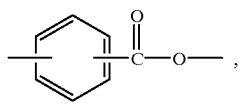 (II),

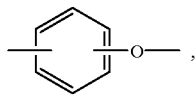 (III),

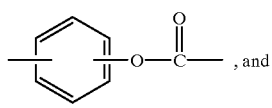 (IV), and

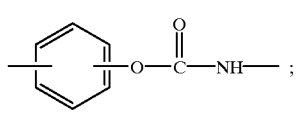 (V);

(c) Q is selected from the group consisting of

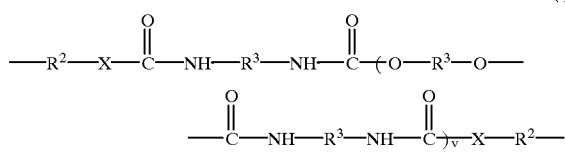 (i)

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; and X is O, S, N, or P; and v is 0 to 50;

$(CR^1_2)_e$—$[SiR^4_2$—$O]_f$—$SiR^4_2$—$(CR^1_2)_g$— (ii)

which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50;

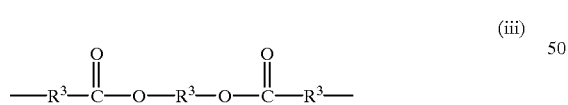 (iii)

in which $R^3$ is an alkyl or alkyloxy chain having up to 100 atoms in the chain, which chain may contain aryl substituents;

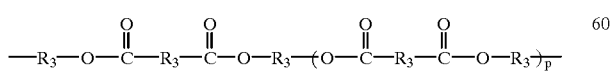 (iv)

in which p is 1 to 100, each $R^3$ independently is an alkyl or alkyloxy chain having up to 100 atoms in the chain, which chain may contain aryl substituents, or $R^3$ is a siloxane having the structure —$(CR^1_2)_e$— $[SiR^4_2$—$O]_f$—$SiR^4_2$—$(CR^1_2)_g$— in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50;

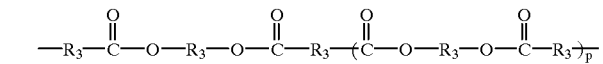 (v)

in which p is 1 to 100, each $R^3$ independently is an alkyl or alkyloxy chain having up to 100 atoms in the chain, which chain may contain aryl substituents, or $R^3$ is a siloxane having the structure —$(CR^1_2)_e$— $[SiR^4_2$—$O]_f$—$SiR^4_2$—$(CR^1_2)_g$— in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50.

2. An underfill encapsulant comprising an allylated amide compound; a curing initiator selected from the group consisting of a free-radical initiator, a photoinitiator, and a combination of those; optionally, one or more fillers; optionally, one or more adhesion promoters;

the allylated amide compound having the formula

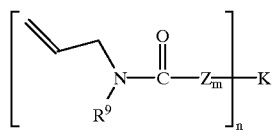

in which m is 0 or 1, n is 1–6, and (a) $R^9$ is H, an alkyl or alkyleneoxy group having 1 to 18 carbon atoms, allyl, aryl, or substituted aryl having the structure

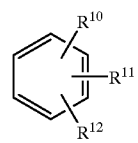

in which $R^{10}$, $R^{11}$, and $R^{12}$ are independently H or an alkyl or alkyleneoxy group having 1 to 18 carbon atoms;

(b) K is an aromatic group selected from group of aromatic groups having the structures:

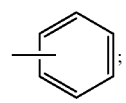 (VI)

-continued

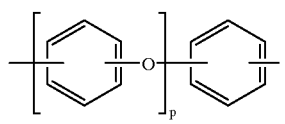
(VII)

in which p is 1 to 100;

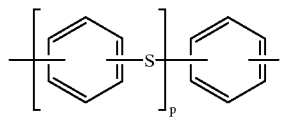
(VIII)

in which p is 1 to 100;

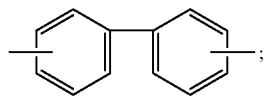
(IX)

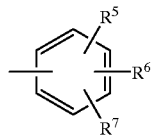
(X)

in which $R^5$, $R^6$, and $R^7$ are a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the backbone in the chain, and in which any heteratom present may or may not be directly attached to the aromatic ring; or
$R^5$, $R^6$, and $R^7$ are a siloxane having the structure $-(CR^1_2)_e-[SiR^4_2-O]_f-SiR^4_2-(CH_3)_g-$ in which the $R^1$ substituent is H or an alkyl group having 1 to 5 carbon atoms and the $R^4$ substituent independently for each position is an alkyl group having 1 to 5 carbon atoms or an aryl group, and e is 1 to 10 and f is 1 to 50;

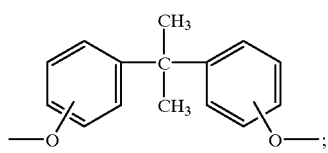
(XI)

-continued

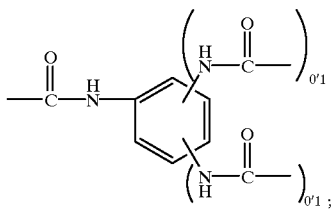
(XII)

and

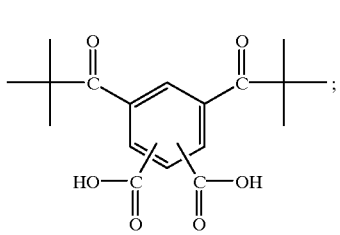
(XIII)

and
(c) Z is selected from the group consisting of
(i) a linear or branched chain alkyl, alkyloxy, alkyl amine, alkyl sulfide, alkylene, alkyleneoxy, alkylene amine, alkylene sulfide, aryl, aryloxy, or aryl sulfide species having up to about 100 atoms in the chain, which may contain saturated or unsaturated cyclic or heterocyclic substituents pendant from the chain or as part of the chain, and in which any heteroatom present may or may not be directly attached to K;

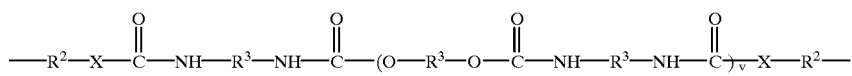
(ii)

in which each $R^2$ independently is an alkyl, aryl, or arylalkyl group having 1 to 18 carbon atoms; $R^3$ is an alkyl or alkyloxy chain having up to 100 atoms in the chain, which chain may contain aryl substituents; and X is O, S, N, or P; and v is 0 to 50;

(iii) $-(CR^1_2)_e-[SiR^4_2-O]_f-SiR^4_2-(CR^1_2)_g-$ in which the $R^1$ substituent independently for each position is H or an alkyl group having 1 to 5 carbon atoms, and the $R^4$ substituent independently for each position is an alkyl group having 1 to 5 carbon atoms or an aryl group, and e and g are independently 1 to 10 and f is 1 to 50;

(iv)

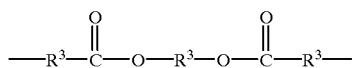

in which R³ is an alkyl or alkyloxy chain having up to 100 atoms in the chain, which chain may contain aryl substituents; or

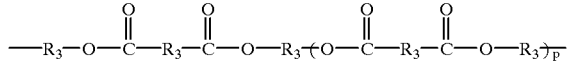

in which p is 1 to 100, each $R^3$ independently is an alkyl or alkyloxy chain having up to 100 atoms in the chain, which chain may contain aryl substituents, or R is a siloxane having the structure $-(CR^1{}_2)_e-[SiR^4{}_2-O]_f-SiR^4{}_2-(CR^1{}_2)_g-$ in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50;

(vi)

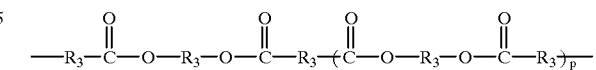

in which p is 1 to 100, each $R^3$ independently is an alkyl or alkyloxy chain having up to 100 atoms in the chain, which chain may contain aryl substituents, or $R^3$ is a siloxane having the structure $-(CR^1{}_2)_e-[SiR^4{}_2-O]_f-SiR^4{}_2-(CR^1{}_2)_g$ — in which the $R^1$ substituent independently for each position is H or an alkyl group having 1 to 5 carbon atoms, the $R^4$ substituent independently for each position is an alkyl group having 1 to 5 carbon atoms or an aryl group, e and g are independently 1 to 10, and f is 1 to 50.

\* \* \* \* \*